(12) United States Patent
Domes

(10) Patent No.: US 11,538,725 B2
(45) Date of Patent: Dec. 27, 2022

(54) SEMICONDUCTOR MODULE ARRANGEMENT

(71) Applicant: Infineon Technologies AG, Neubiberg (DE)

(72) Inventor: Daniel Domes, Ruethen (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 16/937,701

(22) Filed: Jul. 24, 2020

(65) Prior Publication Data

US 2021/0028078 A1 Jan. 28, 2021

(30) Foreign Application Priority Data

Jul. 26, 2019 (EP) .................................... 19188542

(51) Int. Cl.
*H01L 23/049* (2006.01)
*H01L 23/373* (2006.01)
(Continued)

(52) U.S. Cl.
CPC ........ *H01L 23/049* (2013.01); *H01L 23/3735* (2013.01); *H01L 24/32* (2013.01);
(Continued)

(58) Field of Classification Search
CPC . H01L 22/32; H01L 23/3128; H01L 23/5383; H01L 23/5386; H01L 24/09;
(Continued)

(56) References Cited

U.S. PATENT DOCUMENTS

2006/0072261 A1 4/2006 Bayerer et al.
2011/0075451 A1* 3/2011 Bayerer .................. H01L 24/06
363/37

(Continued)

FOREIGN PATENT DOCUMENTS

DE 102013210146 A1 12/2014
EP 3422399 A1 1/2019

*Primary Examiner* — Jasmine J Clark
(74) *Attorney, Agent, or Firm* — Murphy, Bilak & Homiller, PLLC

(57) ABSTRACT

A semiconductor module arrangement includes a housing and at least one pair of semiconductor substrates arranged inside the housing. Each pair of semiconductor substrates includes first and second semiconductor substrates. The first semiconductor substrate includes a first dielectric insulation layer arranged between a first metallization layer and a third metallization layer, and a second dielectric insulation layer arranged between the third metallization layer and a second metallization layer. The second semiconductor substrate includes a first dielectric insulation layer arranged between a first metallization layer and a third metallization layer, and a second dielectric insulation layer arranged between the third metallization layer and a second metallization layer. The third metallization layer of the first semiconductor substrate is electrically coupled to a first electrical potential, and the third metallization layer of the second semiconductor substrate is electrically coupled to a second electrical potential that is opposite to the first electrical potential.

19 Claims, 3 Drawing Sheets

(51) Int. Cl.
*H01L 23/00* (2006.01)
*H01L 25/07* (2006.01)
*H01L 25/18* (2006.01)

(52) U.S. Cl.
CPC .............. *H01L 24/48* (2013.01); *H01L 24/73* (2013.01); *H01L 25/072* (2013.01); *H01L 25/18* (2013.01); *H01L 2224/32225* (2013.01); *H01L 2224/48225* (2013.01); *H01L 2224/73265* (2013.01); *H01L 2924/1203* (2013.01); *H01L 2924/13055* (2013.01); *H01L 2924/13062* (2013.01); *H01L 2924/13064* (2013.01); *H01L 2924/13091* (2013.01); *H01L 2924/14252* (2013.01)

(58) Field of Classification Search
CPC ......... H01L 24/17; H01L 24/49; H01L 24/73; H01L 25/0655
See application file for complete search history.

(56) References Cited

U.S. PATENT DOCUMENTS

2012/0306073 A1 12/2012 Yu et al.
2012/0306091 A1 12/2012 Stolze et al.
2015/0001700 A1 1/2015 Hartung et al.

* cited by examiner

SEMICONDUCTOR MODULE ARRANGEMENT

TECHNICAL FIELD

The instant disclosure relates to semiconductor module arrangements comprising controllable semiconductor elements.

BACKGROUND

Power semiconductor module arrangements often include at least one semiconductor substrate arranged in a housing. A semiconductor arrangement including a plurality of controllable semiconductor elements (e.g., two transistor elements in a half-bridge configuration) is arranged on the at least one substrate. Each substrate usually comprises a substrate layer (e.g., a ceramic layer), a first metallization layer deposited on a first side of the substrate layer and a second metallization layer deposited on a second side of the substrate layer. The controllable semiconductor elements are mounted, for example, on the first metallization layer. The second metallization layer may optionally be attached to a base plate. The controllable semiconductor devices are usually mounted to the semiconductor substrate by soldering or sintering techniques.

There is a need for a semiconductor module arrangement with satisfactory electromagnetic compatibility (EMC) facilitating characteristics which is easy to manufacture without the need for additive manufacturing steps, and which meets the requirements on insulation voltage even for high reverse voltage classes.

SUMMARY

A semiconductor module arrangement includes a housing and at least one pair of semiconductor substrates arranged inside the housing. Each pair of semiconductor substrates includes a first semiconductor substrate, and a second semiconductor substrate. The first semiconductor substrate includes a first dielectric insulation layer arranged between a first metallization layer and a third metallization layer, and a second dielectric insulation layer arranged between the third metallization layer and a second metallization layer. The second semiconductor substrate includes a first dielectric insulation layer arranged between a first metallization layer and a third metallization layer, and a second dielectric insulation layer arranged between the third metallization layer and a second metallization layer. The third metallization layer of the first semiconductor substrate is electrically coupled to a first electrical potential, and the third metallization layer of the second semiconductor substrate is electrically coupled to a second electrical potential that is opposite to the first electrical potential The invention may be better understood with reference to the following drawings and the description. The components in the figures are not necessarily to scale, emphasis instead being placed upon illustrating the principles of the invention. In the figures, like reference numerals designate corresponding parts throughout the different views.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description, as well as in the claims, designations of certain elements as "first element", "second element", "third element" etc. are not to be understood as enumerative. Instead, such designations serve solely to address different "elements". That is, e.g., the existence of a "third element" does not require the existence of a "first element" and a "second element". An electrical line as described herein may be a single electrically conductive element, or include at least two individual electrically conductive elements connected in series and/or parallel. Electrical lines may include metal and/or semiconductor material, and may be permanently electrically conductive (i.e., non-switchable). An electrical line may have an electrical resistivity that is independent from the direction of a current flowing through it. A semiconductor body as described herein may be made of (doped) semiconductor material and may be a semiconductor chip or be included in a semiconductor chip. A semiconductor body has electrically connecting pads and includes at least one semiconductor element with electrodes. The pads are electrically connected to the electrodes which includes that the pads are the electrodes and vice versa.

Figure 1:
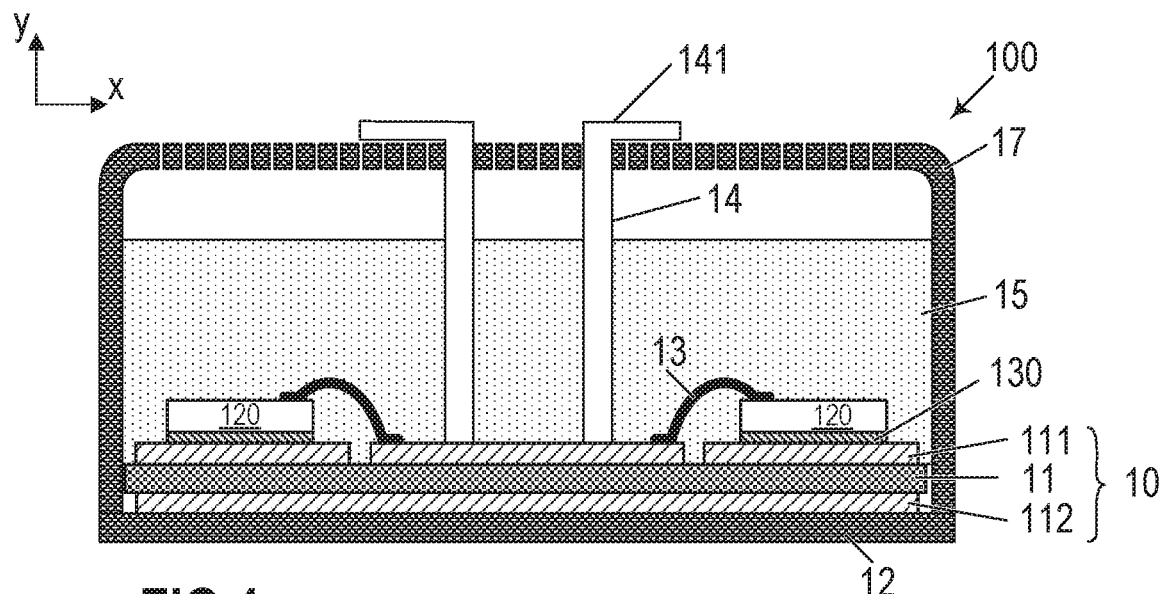
FIG. 1 schematically illustrates a cross-sectional view of a semiconductor module arrangement.

Referring to FIG. 1, a cross-sectional view of a power semiconductor module arrangement 100 is schematically illustrated. The power semiconductor module arrangement 100 includes a housing 17 and a semiconductor substrate 10. The semiconductor substrate 10 includes a dielectric insulation layer 11, a (structured) first metallization layer 111 attached to the dielectric insulation layer 11, and a (structured) second metallization layer 112 attached to the dielectric insulation layer 11. The dielectric insulation layer 11 is disposed between the first and second metallization layers 111, 112.

Each of the first and second metallization layers 111, 112 may consist of or include one of the following materials: copper; a copper alloy; aluminum an aluminum alloy; any other metal or alloy that remains solid during the operation of the power semiconductor module arrangement. The semiconductor substrate 10 may be a ceramic substrate, that is, a substrate in which the dielectric insulation layer 11 is a ceramic, e.g., a thin ceramic layer. The ceramic may consist of or include one of the following materials: aluminum oxide; aluminum nitride; zirconium oxide; silicon nitride; boron nitride; or any other dielectric ceramic. For example, the dielectric insulation layer 11 may consist of or include one of the following materials: $Al_2O_3$, AlN, SiC, BeO or $Si_3N_4$. For instance, the substrate 10 may, e.g., be a Direct Copper Bonding (DCB) substrate, a Direct Aluminum Bonding (DAB) substrate, or an Active Metal Brazing (AMB) substrate. Further, the substrate 10 may be an Insulated Metal Substrate (IMS). An Insulated Metal Substrate generally comprises a dielectric insulation layer 11 comprising (filled) materials such as epoxy resin or polyimide, for example. The material of the dielectric insulation layer 11 may be filled with ceramic particles, for example. Such particles may comprise, e.g., $Si_2O$, $Al_2O_3$, AlN, or BN and may have a diameter of between about 1 µm and about 50 µm. The substrate 10 may also be a conventional printed circuit board (PCB) having a non-ceramic dielectric insulation layer 11. For instance, a non-ceramic dielectric insulation layer 11 may consist of or include a cured resin.

The semiconductor substrate 10 is arranged in a housing 17. In the example illustrated in FIG. 1, the semiconductor substrate 10 is arranged on a base plate 12 which forms a ground surface of the housing 17, while the housing 17 itself solely comprises sidewalls and a cover. This is, however, only an example. It is also possible that the housing 17 further comprises a ground surface and the semiconductor substrate 10 and an (optional) base plate 12 be arranged inside the housing 17. In some power semiconductor module arrangements 100, more than one semiconductor substrate 10 is arranged on a single base plate 12 or on the ground surface of a housing 17.

One or more semiconductor bodies 120 may be arranged on the at least one semiconductor substrate 10. Each of the semiconductor bodies 120 arranged on the at least one semiconductor substrate 10 may include a diode, an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), and/or any other suitable semiconductor element.

The one or more semiconductor bodies 120 may form a semiconductor arrangement on the at least one semiconductor substrate 10. In FIG. 1, only two semiconductor bodies 120 are exemplarily illustrated. The second metallization layer 112 of the semiconductor substrate 10 in FIG. 1 is a continuous layer. The first metallization layer 111 is a structured layer in the example illustrated in FIG. 1. "Structured layer" in this context means that the first metallization layer 111 is not a continuous layer, but includes recesses between different sections of the layer. Such recesses are schematically illustrated in FIG. 1. The first metallization layer 111 in this example includes three different sections. This, however, is only an example. Any other number of sections is possible. Different semiconductor bodies 120 may be mounted to the same or to different sections of the first metallization layer 111. Different sections of the first metallization layer 111 may have no electrical connection or may be electrically connected to one or more other sections using, e.g., bonding wires 13. Electrical connections 13 may also include bonding ribbons, connection plates or conductor rails, for example, to name just a few examples. The one or more semiconductor bodies 120 may be electrically and mechanically connected to the semiconductor substrate 10 by an electrically conductive connection layer 130. Such an electrically conductive connection layer may be a solder layer, a layer of an electrically conductive adhesive, or a layer of a sintered metal powder, e.g., a sintered silver powder, for example.

According to other examples, it is also possible that the second metallization layer 112 is a structured layer. It is further possible to omit the second metallization layer 112 altogether. It is generally also possible that the first metallization layer 111 is a continuous layer, for example.

The power semiconductor module arrangement 100 illustrated in FIG. 1 further includes terminal elements 14. The terminal elements 14 are electrically connected to the first metallization layer 111 and provide an electrical connection between the inside and the outside of the housing 17. The terminal elements 14 may be electrically connected to the first metallization layer 111 with a first end, while a second end 141 of each of the terminal elements 14 protrudes out of the housing 17. The terminal elements 14 may be electrically contacted from the outside at their respective second ends 141. A first part of the terminal elements 14 may extend through the inside of the housing 17 in a vertical direction y. The vertical direction y is a direction perpendicular to a top surface of the semiconductor substrate 10, wherein the top surface of the semiconductor substrate 10 is a surface on which the at least one semiconductor body 120 is mounted. The terminal elements 14 illustrated in FIG. 1, however, are only examples. Terminal elements 14 may be implemented in any other way and may be arranged anywhere within the housing 17. For example, one or more terminal elements 14 may be arranged close to or adjacent to the sidewalls of the housing 17. Terminal elements 14 could also protrude through the sidewalls of the housing 17 instead of through the cover.

The semiconductor bodies 120 each may include a chip pad metallization (not specifically illustrated), e.g., a source, drain, emitter, collector, anode, cathode or gate metallization. A chip pad metallization generally provides a contact surface for electrically connecting the semiconductor body 120. The chip pad metallization may electrically contact a connection layer 130, a terminal element 14, or an electrical connection 13, for example. A chip pad metallization may consist of or include a metal such as aluminum, copper, gold or silver, for example. The electrical connections 13 and the terminal elements 14 may also consist of or include a metal such as copper, aluminum, gold, or silver, for example.

The power semiconductor module arrangement 100 generally further includes a casting compound 15. The casting compound 15 may consist of or include a silicone gel or may be a rigid molding compound, for example. The casting compound 15 may at least partly fill the interior of the housing 17, thereby covering the components and electrical connections that are arranged on the semiconductor substrate 10. The terminal elements 14 may be partly embedded in the casting compound 15. At least their second ends 141, however, are not covered by the casting compound 15 and protrude from the casting compound 15 through the housing 17 to the outside of the housing 17. The casting compound 15 is configured to protect the components and electrical connections inside the power semiconductor module 100, in particular inside the housing 17, from certain environmental conditions and mechanical damage.

As has been described above, two or more semiconductor bodies 120 may form a semiconductor arrangement on the at least one semiconductor substrate 10. Arranging two or more semiconductor bodies 120 in a half-bridge arrangement is only one example. A semiconductor arrangement may also include, e.g., an ANPC (Active Neutral-Point Clamped) topology, for example. An ANPC topology includes several controllable semiconductor elements (e.g., six controllable semiconductor elements), each semiconductor element having a load path formed between a first load electrode (e.g. a source electrode or an emitter electrode) and a second load electrode (e.g. a drain electrode or a collector electrode), and a control electrode (e.g. a gate or base electrode). Other topologies that may be implemented in a semiconductor arrangement include neutral point clamped (NPC) topologies (e.g., so-called NPC1 or NPC2 topologies), for example.

Figure 2:
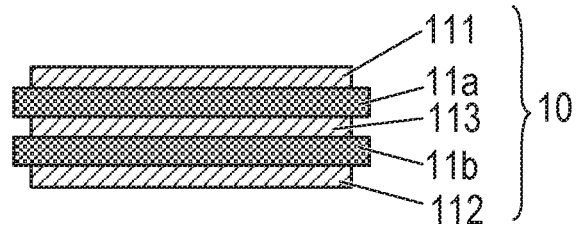
FIG. 2 schematically illustrates a cross-sectional view of an exemplary multi-layer semiconductor substrate.

Now referring to FIG. 2, a multi-layer semiconductor substrate 10 is exemplarily illustrated. In addition to the dielectric insulation layer 11, the first metallization layer 111 and the second metallization layer 112 that have been described with respect to FIG. 1 above, a semiconductor substrate 10 may further comprise an additional dielectric insulation layer and a third metallization layer. That is, the multi-layer semiconductor substrate 10 illustrated in FIG. 2 comprises a first dielectric insulation layer 11a, a second dielectric insulation layer 11b, a first metallization layer 111, a second metallization layer 112, and a third metallization layer 113. The third metallization layer 113 is arranged between the first dielectric insulation layer 11a and the second dielectric insulation layer 11b. The first metallization layer 111 is arranged on a surface of the first dielectric insulation layer 11a opposite to the surface on which the third metallization layer 113 is arranged. The second metallization layer 112 is arranged on a surface of the second dielectric insulation layer 11b opposite to the surface on which the third metallization layer 113 is arranged. In other words, the first dielectric insulation layer 11a is arranged between the first metallization layer 111 and the third metallization layer 113, and the second dielectric insulation layer 11b is arranged between the second metallization layer 112 and the third metallization layer 113.

In the example of FIG. 2, no electrical connection is provided between the first metallization layer 111 and the third metallization layer 113, or between the second metallization layer 112 and the third metallization layer 113. In the example of FIG. 2, the metallization layers 111, 112, 113 are continuous metallization layers. The multi-layer semiconductor substrate 10 of FIG. 2, however, is only an example. Generally, it is also possible that a semiconductor substrate 10 comprises more than two dielectric insulation layers and more than three metallization layers. Any additional dielectric insulation layers 11 may consist of or include the same materials as have been described with respect to the dielectric insulation layer 11 with respect to FIG. 1 above. Any additional metallization layers may consist of or include the same materials as have been described with respect to the first and second metallization layers 111, 112 with respect to FIG. 1 above.

Figure 3:
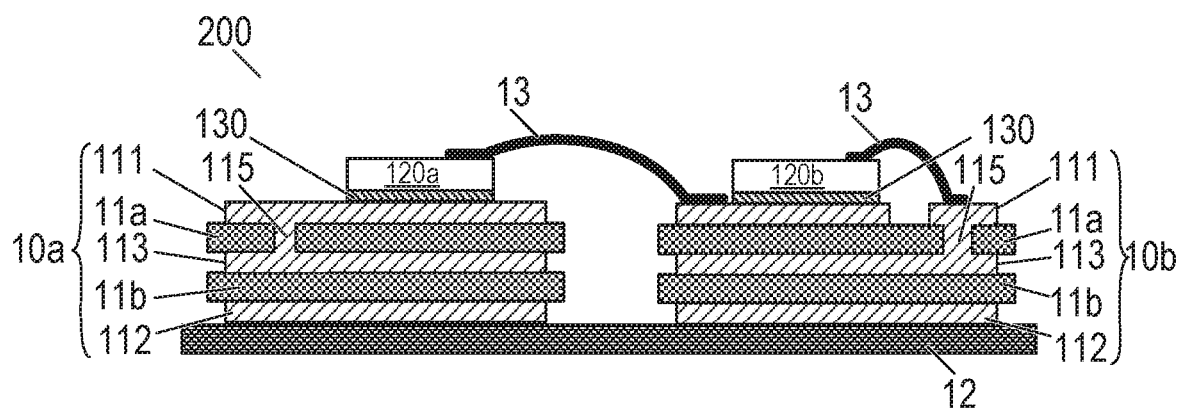
FIG. 3 schematically illustrates a cross-sectional view of an exemplary semiconductor module arrangement.

Now referring to FIG. 3, a semiconductor module arrangement 200 is exemplarily illustrated. The semiconductor module arrangement 200 comprises two multi-layer semiconductor substrates 10a, 10b that are arranged on a base plate 12. Each of the two multi-layer semiconductor substrates 10a, 10b is similar to the multi-layer semiconductor substrate 10 that has been described with respect to FIG. 2 above. However, in the example of FIG. 3, the first multi-layer semiconductor substrate 10a comprises a first metallization layer 111 that is a continuous layer. Further, an electrical connection is provided between the first metallization layer 111 and the third metallization layer 113. For example, a so-called via 115 may be provided in the first dielectric insulation layer 11a. The via 115 may be filled with an electrically conducting material. For example, such material may be identical to the material of the first, second and third metallization layers 11, 112, 113. The via 115 may be formed by a hole or an opening in the first dielectric insulation layer 11a. Such a hole or opening may have a rounded, rectangular or square cross-section, for example. Other cross-sections, however, are also possible. The via generally extends through the first dielectric insulation layer 11a, from the first metallization layer 111 to the third metallization layer 113.

The first metallization layer 111 of the second semiconductor substrate 10b is a structured layer. In the example of FIG. 3, the first metallization layer 111 of the second substrate 10b comprises two separate sections. However, as will be described further below, it is also possible that the first metallization layer 111 of a semiconductor substrate 10 comprises more than two separate sections. The number of sections may depend on the kind of semiconductor arrangement that is implemented on the semiconductor substrates 10a, 10b, for example. One of the sections of the first metallization layer 111 of the second substrate 10b is electrically coupled to the third metallization layer 113 of the second semiconductor substrate 10b. As has been described with respect to the first semiconductor substrate 10a above, a via 115 may be provided in (may extend through) the first dielectric insulation layer 11a in order to couple the second section of the first metallization layer 111 to the third metallization layer 113. The third metallization layer 113 of the first semiconductor substrate 10a and the third metallization layer 113 of the second semiconductor substrate 10b are both continuous layers in the example illustrated in FIG. 3. Generally, however, it is also possible that the third metallization layer 113 is a structured layer.

In the arrangement of FIG. 3, a first semiconductor body 120a is arranged on the first semiconductor substrate 10a, and a second semiconductor body 120b is arranged on the second semiconductor substrate 10b. The first semiconductor body 120a is electrically coupled to the first metallization layer 111 of the first semiconductor substrate 10a by means of an electrically conductive connection layer 130. The first semiconductor body 120a is further electrically coupled to the first metallization layer 111 of the second semiconductor substrate 10b via an electrical connection 13 such as a bonding wire, for example. The electrical connection 13 may be mechanically connected to a top surface of the first semiconductor body 120a, wherein a top surface of a semiconductor body 120 is a surface facing away from the semiconductor substrate 10 it is mounted to. The second semiconductor body 120b is electrically coupled to the first section of the first metallization layer 111 of the second semiconductor substrate 10b by means of an electrically conductive connection layer 130. The second semiconductor body 120b is further electrically coupled to the second section of the first metallization layer 111 of the second semiconductor substrate 10b via an electrical connection 13 such as a bonding wire, for example. The electrical connection 13 may be mechanically connected to a top surface of the second semiconductor body 120b. In this way, the first semiconductor body 120a and the second semiconductor body 120b may form a half-bridge arrangement, for example.

Figure 4:
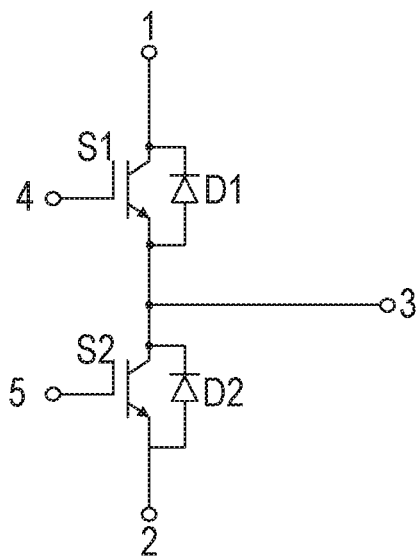
FIG. 4 is a circuit diagram of an exemplary semiconductor arrangement.

FIG. 4 is a circuit diagram of an exemplary half-bridge arrangement. The half-bridge arrangement is configured to convert a DC voltage provided at an input 1, 2 of the half-bridge arrangement into an AC voltage provided at an output 3 of the half-bridge arrangement. The AC voltage may be provided to, e.g., a load (not illustrated) that is coupled to the output 3 of the half-bridge arrangement. The half-bridge arrangement is coupled between a first supply node 1 which is configured to be operatively coupled to a first electrical potential, and a second supply node 2 which is configured to be operatively coupled to a second electrical potential. The first electrical potential may be a positive potential DC+ and the second electrical potential may be a negative potential DC− to supply a DC voltage via the first and second supply nodes 1, 2. The first and second supply nodes 1, 2 form the input of the half-bridge arrangement.

The half-bridge may include one high-side switch S1 (first switch, or first controllable semiconductor element) and one low-side switch S2 (second switch, or first controllable semiconductor element) coupled in series to each other and between the first supply node 1 and the second supply node 2. The half-bridge arrangement may be configured to drive a load (not specifically illustrated) at its output node 3. The load may be an inductive load, for example. The output node 3 is electrically connected to a common node between the high-side switch S1 and the low-side switch S2.

In the circuit arrangement of FIG. 4, each switch S1, S2 of the half-bridge arrangement is implemented as an IGBT (insulated-gate bipolar transistor). Each of the switches S1, S2 may comprise either an internal or an external diode element D1, D2 (freewheeling diode) coupled in parallel to its respective load path. According to another example, each of the switches S1, S2 comprises two or more separate switching elements electrically coupled in parallel to each other (not illustrated).

Each of the first switch S1 and the second switch S2 includes a control electrode 4, 5 and a controllable load path between a first load electrode and a second load electrode. The load paths of the first switch S1 and the second switch S2 are coupled in series and between the first supply node 1 and the second supply node 2.

Figure 5:
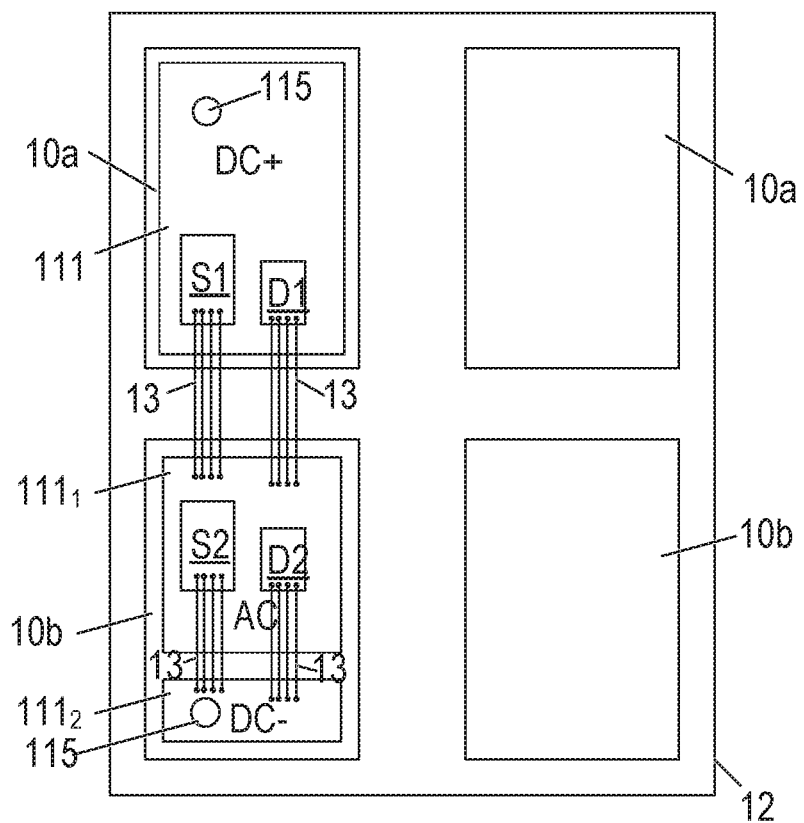
FIG. 5 is a top view of an exemplary semiconductor module arrangement.

Now referring to FIG. 5, a top view of an exemplary semiconductor arrangement is schematically illustrated. The semiconductor arrangement of FIG. 5 may correspond to the half-bridge arrangement as illustrated in FIG. 4. The first semiconductor substrate 10a and the second semiconductor substrate 10b are arranged on a base plate 12. The base plate 12 may be arranged in a semiconductor housing 17, as has been described with respect to FIG. 1 above. Instead of a base plate 12, the semiconductor substrates 10a, 10b may be arranged on a ground surface of a housing 17, if the semiconductor arrangement does not comprise a base plate 12. Generally speaking, the first semiconductor substrate 10a and the second semiconductor substrate 10b are arranged in the same housing 17, irrespective of whether the semiconductor module arrangement comprises a base plate 12 or not. The first semiconductor substrate 10a and the second semiconductor substrate 10b form a pair of semiconductor substrates. As is indicated in FIG. 5, the semiconductor arrangement, optionally, may comprise more than one pair of semiconductor substrates 10a, 10b. In FIG. 5, two pairs of semiconductor substrates 10a, 10b are schematically illustrated, wherein the essential features are only illustrated for one pair and have been omitted for the second pair for the sake of clarity only. The arrangement may even comprise more than two pairs of semiconductor substrates 10a, 10b.

Generally speaking, a semiconductor arrangement comprises at least one pair of semiconductor substrates 10a, 10b. That is, a semiconductor arrangement comprises an even number of (a multiple of two) semiconductor substrates 10. Each pair of the at least one pair of semiconductor substrates comprises a first semiconductor substrate 10a and a second semiconductor substrate 10b. Each of the first and second semiconductor substrate 10a, 10b comprises at least two dielectric insulation layers 11a, 11b and at least three metallization layers 111, 112, 113. That is, each semiconductor substrate 10a, 10b comprises at least one middle metallization layer 113 that is arranged between two dielectric insulation layers 11a, 11b. If a semiconductor substrate 10 comprises more than two dielectric insulation layers 11, there may be more than one middle metallization layer. At least one middle metallization layer (third metallization layer 113 in FIG. 3) is in electrical contact with at least one section of the first metallization layer 111, the first metallization layer 111 being an outer metallization layer on which at least one semiconductor body 120 is or may be mounted. The first metallization layer 111 is in direct contact with only one of the dielectric insulation layers 11 (first dielectric insulation layer 11a in FIG. 5).

In the arrangement illustrated in FIG. 5, the first metallization layer 111 of the first semiconductor substrate 10a only comprises one (a single/not more than one) section. A first controllable switching element S1 is arranged on the first metallization layer 111 of the first semiconductor substrate 10a. Further, a first diode element D1 is arranged on the first metallization layer 111 of the first semiconductor substrate 10a. The first diode element D1, however, is optional. The single section of the first metallization layer 111 of the first semiconductor substrate 10a is electrically coupled to the third metallization layer 113 of the first semiconductor substrate 10a (as illustrated in FIG. 3). The first metallization layer 111 of the first semiconductor substrate 10a may form or may be coupled to a first supply node, wherein the first supply node is coupled to a first electrical potential (e.g., DC+). Tat is, the first metallization layer 111 and the third metallization layer 113 which is electrically coupled to the first metallization layer 111 are both electrically coupled to the first electrical potential.

The first metallization layer 111 of the second semiconductor substrate 10b comprises two separate sections $111_1$, $111_2$ in the example of FIG. 5. A second controllable switching element S2 is arranged on a first section $111_1$ of the first metallization layer 111 of the second semiconductor substrate 10b. Further, a second diode element D2 is arranged on the first section $111_1$ of the first metallization layer 111 of the second semiconductor substrate 10b. The second diode element D2, however, is optional. The first controllable switching element S1 and the first diode element D1 each may be electrically coupled to the first section $111_1$ of the first metallization layer 111 of the second semiconductor substrate 10b by means of at least one electrical connection 13, respectively. The first section $111_1$ of the first metallization layer 111 of the second semiconductor substrate 10b may form or may be coupled to an output. According to the exemplary half-bridge arrangement of FIG. 4, an AC voltage may be provided at the output, for example. The second controllable semiconductor element S2 and the second diode element D2 each may be electrically coupled to a second section $111_2$ of the first metallization layer 111 of the second semiconductor substrate 10b by means of at least one electrical connection 13, respectively. The second section $111_2$ of the first metallization layer 111 of the second semiconductor substrate 10b may form or may be coupled to a second supply node, wherein the second supply node is coupled to a second electrical potential which is an electrical potential opposite to the first electrical potential.

As the first metallization layer 111 of the first semiconductor substrate 10a is electrically coupled to the third metallization layer 113 of the first semiconductor substrate, the third metallization layer 133 is also coupled to the first electrical potential. The third metallization layer 113 of the second semiconductor substrate 10b is electrically coupled to the second section $111_2$ of the first metallization layer 111 of the second semiconductor substrate 10b and is therefore coupled to the second electrical potential. That is, according to one example, in a pair of semiconductor substrates 10a, 10b, the middle metallization layer (third metallization layer) 113 of a first substrate 10a is coupled to an electrical potential that is opposite to the electrical potential the middle metallization layer (third metallization layer) 113 of the second semiconductor substrate 10b is coupled to. That is, if the middle metallization layer 113 of the first semiconductor substrate 10a is coupled to a positive potential, the middle metallization layer of the second substrate 10b of the same pair of semiconductor substrates 10a, 10b is coupled to a negative potential and vice versa. Further pairs of semiconductor substrates 10a, 10b that are arranged within the same package 17 as the first pair may be built in the same way.

According to one example, the size (dimensions) of the first semiconductor substrate 10a may equal the size (dimensions) of the second semiconductor substrate 10b of the same pair of semiconductor substrates 10a, 10b. That is, a length of a dielectric insulation layer 11a, 11b of the first semiconductor substrate 10a in a first horizontal direction x may equal a length of a corresponding dielectric insulation layer 11a, 11b of the second semiconductor substrate 10b in the same direction. The same applies for a width of the dielectric insulation layers 11a, 11b in a second horizontal direction z. Further, the dimensions of the third metallization layer 113 (middle metallization layer) of the first semiconductor substrate 10a may equal the dimensions of the third metallization layer 113 (middle metallization layer) of the second semiconductor substrate 10b of the same pair of semiconductor substrates 10a, 10b. That is, a length of a third metallization layer 113 of the first semiconductor substrate 10a in a first horizontal direction x may equal a length of a corresponding third metallization layer 113 of the second semiconductor substrate 10b in the same direction. The same applies for a width of the third metallization layers 113 in the second horizontal direction z. The horizontal directions x, z are directions that are parallel to a top surface of the semiconductor substrates 10a, 10b, wherein a top surface of a semiconductor substrate 10 is a surface on which at least one semiconductor body 120 is or may be mounted.

However, the dimensions of the dielectric insulation layers 11a, 11b and/or the third metallization layers 113 of the first and second semiconductor substrates 10a, 10b of a pair of semiconductor substrates being equal is merely an example. According to another example, a surface area of the third metallization layer 113 of the first semiconductor substrate 10a is between 95% and 105% of the surface area of the third metallization layer 113 of the corresponding second semiconductor substrate 10b. That is, there may be a certain deviation between the surface areas. The surface area of a metallization layer is determined by its length in the first horizontal direction x, and its width in the second horizontal direction z. The same applies for the dielectric insulation layers 11a, 11b. According to one example, a surface area of the first dielectric insulation layer 11a of the first semiconductor substrate 10a is between 95% and 105% of the surface area of the first dielectric insulation layer 11a of the corresponding second semiconductor substrate 10b. According to one example, a surface area of the second dielectric insulation layer 11b of the first semiconductor substrate 10a is between 95% and 105% of the surface area of the second dielectric insulation layer 11b of the corresponding second semiconductor substrate 10b.

In the arrangement illustrated in FIG. 5, the first switch S1, and optionally the first diode element D1, of a semiconductor arrangement are arranged on a first semiconductor substrate 10a, and the second switch S2, and optionally the second diode element D2, of the semiconductor arrangement are arranged on a second semiconductor substrate 10b, the first and the second semiconductor substrate 10a, 10b forming a pair of semiconductor substrates. This, however, is only an example.

Figure 6:
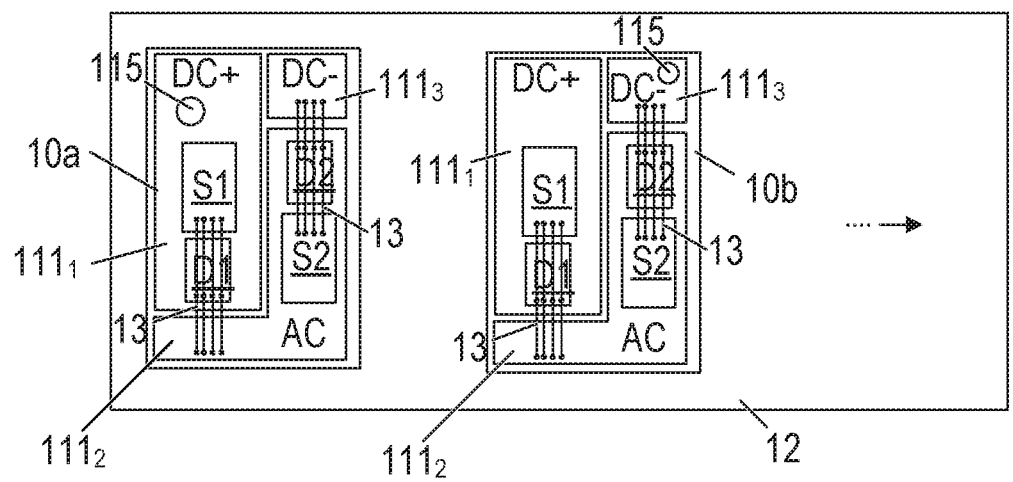
FIG. 6 is a top view of another exemplary semiconductor module arrangement.

Now referring to FIG. 6, it is also possible that more than one switch, and optionally more than one diode element, is arranged on a substrate 10. In the example illustrated in FIG. 6, the first semiconductor substrate 10a comprises a structured first metallization layer 111. The first metallization layer 111 of the first semiconductor substrate 10a comprises three different sections $111_1$, $111_2$, $111_3$ in the example of FIG. 6. However, generally it is also possible that the first metallization layer 111 of the first semiconductor substrate 10a comprises more than three sections. A first controllable semiconductor element S and a first diode element D1 are mounted and electrically coupled to a first section $111_1$ of the first metallization layer 111. A second controllable semiconductor element S2 and a second diode element D2 are mounted to a second section $111_2$ of the first metallization layer 111. The first section $111_1$ is electrically coupled to a first electrical potential. The first electrical potential may be a positive potential DC+, for example. The first controllable semiconductor element S1 and the first diode element D1 are electrically coupled to the second section $111_2$ by means of at least one electrical connection 13. The second section $111_2$ may form or may be coupled to an output of the semiconductor arrangement. The first controllable semiconductor element S1, and the second controllable semiconductor element S2 may form a half-bridge arrangement, for example. An AC voltage therefore may be provided at the output of the semiconductor arrangement, for example. The second controllable semiconductor element S2 and the second diode element D2 may be electrically coupled to the third section $111_3$ by means of at least one electrical connection 13. The third section $111_3$ may be electrically coupled to a second electrical potential that is opposite to the first electrical potential. That is, if the first electrical potential is a positive potential DC+, the second electrical potential is a negative potential DC− and vice versa.

The first section $111_1$ may be electrically coupled to a middle metallization layer (third metallization layer) 113 of the first semiconductor substrate 10a by means of a via 115, for example. That is, the middle metallization layer 113 of the first semiconductor substrate 10a is electrically coupled to the first electrical potential DC+.

The first semiconductor substrate 10a and the second semiconductor substrate 10b form a pair of substrates. The second semiconductor substrate 10b illustrated in FIG. 6 generally has a similar structure as compared to the first semiconductor substrate 10a. However, instead of the first section $111_1$, the second section $111_2$ of the first metallization layer 111 is electrically coupled to the middle metallization layer (third metallization layer) 113 by means of a via 115. That is, the middle metallization layer 113 of the second semiconductor substrate 10b is electrically coupled to the second electrical potential DC−. Similar to the arrangement illustrated in FIG. 5, in the arrangement of FIG. 6 one semiconductor substrate of a pair of semiconductor substrates 10a, 10b comprises a middle metallization layer 113 that is coupled to the first potential, while the other one of the semiconductor substrates of the pair of semiconductor substrates 10a, 10b comprises a middle metallization layer 113 that is coupled to a second electrical potential that is opposite to the first electrical potential.

In the example illustrated in FIG. 6, one pair of semiconductor substrates 10a, 10b is schematically illustrated. However, it is also possible to arrange more than one pair of semiconductor substrate 10a, 10b on the base plate 12, or generally speaking inside the same housing 17.

In the example of FIG. 6, the first semiconductor substrate 10a is somewhat different from the second semiconductor substrate 10b. In particular, the vias 115 are arranged in different places on the respective substrates and are each configured to electrically couple a different one of the sections of the first metallization layer 111 to the middle metallization layer 113 (first semiconductor substrate 10a: via 115 between first section $111_1$ and middle metallization layer 113; second semiconductor substrate 10b: via 115 between third section $111_3$ and middle metallization layer 113). This, however, is only an example.

Figure 7A:
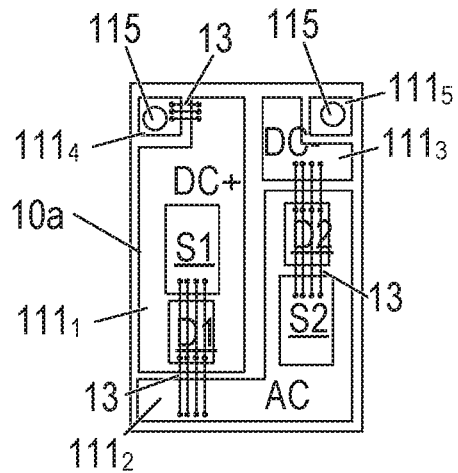
FIGS. 7A to 7C illustrate respective top views on semiconductor substrates according to another example.
Figure 7B:
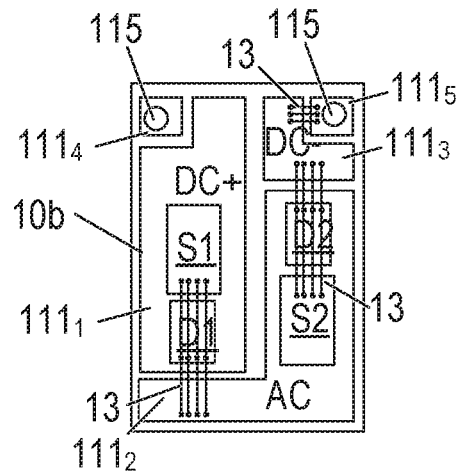
Figure 7C:
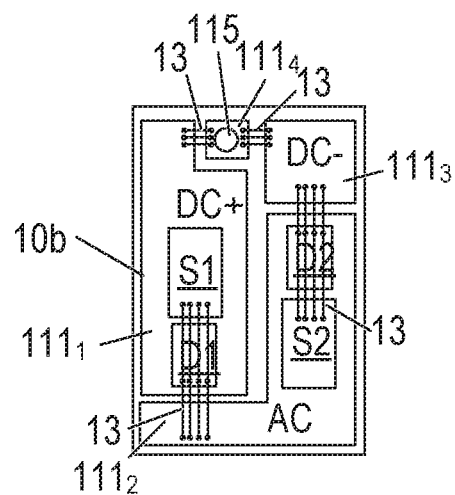

According to another example, as is exemplarily illustrated in FIGS. 7A and 7B, the general structure of the first semiconductor substrate 10a (FIG. 7A) may be identical to the general structure of the second semiconductor substrate 10b (FIG. 7B). That is, the first semiconductor substrate 10a may comprise the same number of metallization layers 111, 112, 113 as the second semiconductor substrate 10b, as well as the same number of dielectric insulation layers 11a, 11b. Further, the first metallization layer 111 of the first semiconductor substrate 10a may comprise the same number of sections as the first metallization layer 111 of the second semiconductor substrate 10b. In the examples of FIGS. 7A through 7C, the first semiconductor substrate 10a and the second semiconductor substrate 10b each comprise a first metallization layer 111 having five different sections.

The general structure is similar to the structure that has been described with respect to FIG. 6 above. A first controllable semiconductor element S1 and an (optional) first diode element D1 are mounted and electrically coupled to the first section $111_1$ of the first metallization layer 111. A second controllable semiconductor element S2 and an (optional) second diode element D2 are mounted to the second section $111_2$ of the first metallization layer 111. The first section $111_1$ is electrically coupled to a first electrical potential. The first electrical potential may be a positive potential DC+, for example. The first controllable semiconductor element S1 and the optional first diode element D1 are electrically coupled to the second section $111_2$ by means of at least one electrical connection 13. The second section $111_2$ may form or may be coupled to an output of the semiconductor arrangement. The first controllable semiconductor element S1, and the second controllable semiconductor element S2 may form a half-bridge, for example. An AC voltage therefore may be provided at the output of the half-bridge arrangement. The second controllable semiconductor element S2 and the optional second diode element D2 may be electrically coupled to the third section $111_3$ by means of at least one electrical connection 13. The third section $111_3$ may be electrically coupled to a second electrical potential that is opposite to the first electrical potential. That is, if the first electrical potential is a positive potential DC+, the second electrical potential is a negative potential DC− and vice versa.

The fourth section $111_4$ and the fifth section $111_5$ of the first metallization layer 111 are each electrically coupled to the middle metallization layer (third metallization layer) 113 by means of a via 115. However, only one of the fourth section $111_4$ and the fifth section $111_5$ is electrically contacted. On the first semiconductor substrate 10a, at least one electrical connection 13 is provided between the first section $111_1$ and the fourth section $111_4$. However, no electrical connection is provided between the fifth section $111_5$ and any other section of the first metallization layer 111. In this way, the middle metallization layer 113 is electrically coupled to the first potential DC+ through the via 115, the fourth section $111_4$, the at least one electrical connection 13, and the first section $111_1$.

The second semiconductor substrate 10b only differs from the first semiconductor substrate 10a in that the fifth section $111_5$ is electrically contacted instead of the fourth section $111_4$. That is, the middle metallization layer 113 of the second semiconductor substrate 10b is electrically coupled to the second electrical potential DC− through the via 115, the fifth section $111_5$, the at least one electrical connection 13 between the fifth section $111_5$ and the third section $111_3$, and the third section $111_3$. The structure of the semiconductor substrates 10a, 10b illustrated in FIGS. 7A and 7B allows to manufacture identical substrates, independent from their later use as first or second semiconductor substrate in a pair of semiconductor substrates 10a, 10b. The potential of the middle metallization layer (third metallization layer) 113 may be determined by providing corresponding electrical connections 13, either between the fourth section $111_4$ and the first section 111, or between the fifth section $111_5$ and the third section $111_3$.

Another exemplary arrangement that allows the general structure of the first semiconductor substrate 10a to be identical to the general structure of the second semiconductor substrate 10b is illustrated in FIG. 7C. The substrate 10ab illustrated in FIG. 7C is generally similar to the substrate that has been described with respect to FIGS. 7A and 7B above. However, instead of providing two separate fourth and fifth sections $111_4$, $111_5$, only a fourth section $111_4$ may be provided. The fourth section $111_4$ is electrically coupled to the middle metallization layer 113 by means of a via 115. This fourth section $111_4$ may be arranged adjacent to both the first section 111 and the third section $111_3$. In the example illustrated in FIG. 7C, the first section $111_1$ and the third section $111_3$ are both electrically coupled to the fourth section $111_4$ by means of at least one electrical connection 13a, 13b. This, however, is for illustrative purposes only. If the substrate 10ab of FIG. 7C is used as a first substrate 10a of a pair of substrates, only the first section $111_1$ will be electrically coupled to the fourth section $111_4$ by means of at least one electrical connection 13a. If the substrate 10ab of FIG. 7C is used as a second substrate 10b of a pair of substrates, only the third section $111_3$ will be electrically coupled to the fourth section $111_4$ by means of at least one electrical connection 13b. That is, depending on which section $111_1$, $111_3$ is electrically coupled to the fourth section $111_4$, the middle metallization layer 113 of the semiconductor substrate 10 is either electrically coupled to the first electrical potential DC+ or to the second electrical potential DC−.

In the examples described above by means of FIGS. 3 to 7, the sections of the first metallization layer 111 may be electrically connected from outside a housing 17 by means of terminal elements 14, for example, as has been described with respect to FIG. 1 above. For example, a first terminal element 14 may be electrically coupled to a section of the first metallization layer 111, in order to electrically couple this section to a first potential DC+. Another terminal element 14 may be electrically coupled to another section of the first metallization layer in order to couple this section to a second electrical potential DC−. Another terminal element 14 may be electrically coupled to an even further section of the first metallization layer 111, in order to provide an output voltage or an output current to the outside of the housing 17.

Depending on the number of sections, one semiconductor substrate 10 may be electrically connected by one or more than one terminal elements 14.

Throughout the description and the drawings, only such sections $111_n$ of the first metallization layer 111 are illustrated and specifically mentioned that are relevant for the understanding of the different embodiments. However, the first metallization layer 111 may generally comprise more than the different sections mentioned above. For example, additional sections may be required in order to provide control and conductor rails that allow to electrically contact any gate, auxiliary emitter or auxiliary source emitter terminals of the semiconductor bodies. It is further possible, that additional electrical potentials other to those described above are required within a semiconductor module arrangement. Additional sections, therefore, might be required in order to provide such additional potentials.

What is claimed is:

1. A semiconductor module arrangement, comprising:
   a housing; and
   at least one pair of semiconductor substrates arranged inside the housing, each pair of semiconductor substrates comprising a first semiconductor substrate and a second semiconductor substrate, wherein:
   the first semiconductor substrate comprises a first dielectric insulation layer arranged between a first metallization layer and a third metallization layer, and a second dielectric insulation layer arranged between the third metallization layer and a second metallization layer;
   the second semiconductor substrate comprises a first dielectric insulation layer arranged between a first metallization layer and a third metallization layer, and a second dielectric insulation layer arranged between the third metallization layer and a second metallization layer,
   the third metallization layer of the first semiconductor substrate is electrically coupled to a first electrical potential; and
   the third metallization layer of the second semiconductor substrate is electrically coupled to a second electrical potential having an opposite polarity as the first electrical potential such that a voltage is supplied via the third metallization layer of the first semiconductor substrate and the third metallization layer of the second semiconductor substrate.

2. The semiconductor module arrangement of claim 1, wherein a DC voltage is supplied via the third metallization layer of the first semiconductor substrate and the third metallization layer of the second semiconductor substrate.

3. The semiconductor module arrangement of claim 1, further comprising at least a first controllable semiconductor element and a second controllable semiconductor element.

4. The semiconductor module arrangement of claim 3, wherein:
   the first controllable semiconductor element is arranged on the first semiconductor substrate and comprises a control electrode and a load path formed between a first load electrode and a second load electrode; and
   the second controllable semiconductor element is arranged on the second semiconductor substrate and comprises a control electrode and a load path formed between a first load electrode and a second load electrode.

5. The semiconductor module arrangement of claim 4, wherein the load path of the first controllable semiconductor element and the load path of the second controllable semiconductor element are coupled in series.

6. The semiconductor module arrangement of claim 4, wherein:
   the first controllable semiconductor element is electrically coupled to the first metallization layer of the first semiconductor substrate by an electrically conductive connection layer;
   the first controllable semiconductor element is further electrically coupled to the first metallization layer of the second semiconductor substrate by at least one electrical connection;
   the first metallization layer of the second semiconductor substrate comprises at least a first section and a second section;
   the second controllable semiconductor element is electrically coupled to the first section of the first metallization layer of the second semiconductor substrate by an electrically conductive connection layer; and
   the second controllable semiconductor element is further electrically coupled to the second section of the first metallization layer of the second semiconductor substrate by at least one electrical connection.

7. The semiconductor module arrangement of claim 6, wherein each electrical connection comprises one of a bonding wire, a bonding ribbon, a connection plate, and a conductor rail.

8. The semiconductor module arrangement of claim 3, wherein:
   the first metallization layer of the first semiconductor substrate comprises at least a first section, a second section, and a third section;
   the first metallization layer of the second semiconductor substrate comprises at least a first section, a second section, and a third section;
   one first controllable semiconductor element is arranged on the first section, and one second controllable semiconductor element is arranged on the second section of the first metallization layer of the first semiconductor substrate; and
   another first controllable semiconductor element is arranged on the first section, and another second controllable semiconductor element is arranged on the second section of the first metallization layer of the second semiconductor substrate.

9. The semiconductor module arrangement of claim 8, wherein:
   the first section of the first metallization layer of the first semiconductor substrate is electrically coupled to the third metallization layer of the first semiconductor substrate by a via extending through the first dielectric insulation layer of the first semiconductor substrate; and
   the third section of the first metallization layer of the second semiconductor substrate is electrically coupled to the third metallization layer of the second semiconductor substrate by a via extending through the first dielectric insulation layer of the second semiconductor substrate.

10. The semiconductor module arrangement of claim 8, wherein:
    the first metallization layer of the first semiconductor substrate further comprises a fourth section and a fifth section, the fourth section being electrically coupled to the third metallization layer of the first semiconductor substrate by a via extending through the first dielectric insulation layer of the first semiconductor substrate, and the fifth section being electrically coupled to the third metallization layer of the first semiconductor substrate by a via extending through the first dielectric insulation layer of the first semiconductor substrate; and the first metallization layer of the second semiconductor substrate further comprises a fourth section and a fifth section, the fourth section being electrically coupled to the third metallization layer of the second semiconductor substrate by a via extending through the first dielectric insulation layer of the second semiconductor substrate, and the fifth section being electrically coupled to the third metallization layer of the second semiconductor substrate by a via extending through the first dielectric insulation layer of the second semiconductor substrate.

11. The semiconductor module arrangement of claim 10, wherein:
the fourth section of the first metallization layer of the first semiconductor substrate is electrically coupled to the first section of the first metallization layer of the first semiconductor substrate; and
the fifth section of the first metallization layer of the second semiconductor substrate is electrically coupled to the third section of the first metallization layer of the second semiconductor substrate.

12. The semiconductor module arrangement of claim 10, wherein:
the fifth section of the first metallization layer of the first semiconductor substrate is electrically coupled to the third section of the first metallization layer of the first semiconductor substrate; and
the fourth section of the first metallization layer of the second semiconductor substrate is electrically coupled to the first section of the first metallization layer of the second semiconductor substrate.

13. The semiconductor module arrangement of claim 8, wherein:
the first controllable semiconductor element that is arranged on the first section of the first metallization layer of the first semiconductor substrate is further electrically coupled to the second section of the first metallization layer of the first semiconductor substrate by at least one electrical connection;
the second controllable semiconductor element that is arranged on the second section of the first metallization layer of the first semiconductor substrate is further electrically coupled to the third section of the first metallization layer of the first semiconductor substrate by at least one electrical connection;
the first controllable semiconductor element that is arranged on the first section of the first metallization layer of the second semiconductor substrate is further electrically coupled to the second section of the first metallization layer of the second semiconductor substrate by at least one electrical connection; and
the second controllable semiconductor element that is arranged on the second section of the first metallization layer of the second semiconductor substrate is further electrically coupled to the third section of the first metallization layer of the second semiconductor substrate by at least one electrical connection.

14. The semiconductor module arrangement of claim 13, wherein each electrical connection comprises one of a bonding wire, a bonding ribbon, a connection plate, and a conductor rail.

15. The semiconductor module arrangement of claim 3, wherein each of the controllable semiconductor elements comprises at least one of an IGBT, a MOSFET, a JFET, or a HEMT.

16. The semiconductor module arrangement of claim 3, wherein:
at least one first diode element is coupled in parallel to each of the at least one first controllable semiconductor element; and
at least one second diode element is coupled in parallel to each of the at least one second controllable semiconductor element.

17. The semiconductor module arrangement of claim 1, wherein an electrical connection comprises one of a bonding wire, a bonding ribbon, a connection plate, and a conductor rail.

18. The semiconductor module arrangement of claim 1, wherein:
the at least one pair of semiconductor substrates is arranged on a base plate; and
the base plate forms a ground surface of the housing.

19. The semiconductor module arrangement of claim 1, wherein:
the at least one pair of semiconductor substrates is arranged on a base plate; and
the base plate is arranged on a ground surface of the housing.

* * * * *